US012586655B2

(12) United States Patent
Brock-Petersen et al.

(10) Patent No.: US 12,586,655 B2

(45) Date of Patent: Mar. 24, 2026

(54) MEMORY FAILURE ANALYSIS BASED ON BITLINE THRESHOLD VOLTAGE DISTRIBUTIONS

(71) Applicant: Micron Technology, Inc., Boise, ID (US)

(72) Inventors: Kyle B. Brock-Petersen, Boulder, CO (US); Robert Winston Mason, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 18/662,306

(22) Filed: May 13, 2024

(65) Prior Publication Data

US 2024/0395348 A1     Nov. 28, 2024

Related U.S. Application Data

(60) Provisional application No. 63/468,681, filed on May 24, 2023.

(51) Int. Cl.
G11C 29/12 (2006.01)

(52) U.S. Cl.
CPC ................. G11C 29/12005 (2013.01); *G11C 2029/1204* (2013.01)

(58) Field of Classification Search
CPC ...... G11C 29/12005; G11C 2029/1204; G11C 29/021; G11C 29/028; G11C 29/50004

USPC .......................................................... 714/721
See application file for complete search history.

(56) References Cited

U.S. PATENT DOCUMENTS

| | | | |
|---|---|---|---|
| 7,594,157 B2 * | 9/2009 | Choi .................... | G11C 16/105 |
| | | | 714/764 |
| 2015/0135033 A1 * | 5/2015 | Ellis .................... | G11C 11/4074 |
| | | | 714/763 |
| 2020/0042237 A1 * | 2/2020 | Zeng .................... | G11C 11/5642 |
| 2021/0202028 A1 * | 7/2021 | Choi .................. | G11C 29/4401 |
| 2021/0342241 A1 * | 11/2021 | Gurumurthi ........ | G06F 11/3037 |
| 2021/0383206 A1 * | 12/2021 | Teppoeva .............. | G06F 11/004 |

* cited by examiner

*Primary Examiner* — James C Kerveros

(74) *Attorney, Agent, or Firm* — Lowenstein Sandler LLP

(57) ABSTRACT

Described are systems and methods for memory failure analysis based on bitline threshold voltage distributions. An example method of implementing a failure type prediction model includes: receiving, by a processing device, a first failure-related dataset reflecting a first bitline threshold voltage distribution associated with a first memory device; determining, based on the first failure-related dataset, a first failure type distribution for the first memory device; creating a training dataset comprising the first failure-related dataset and the first failure type distribution; and training, using the training dataset, a failure type prediction model to determine, for a second memory device, a second failure type distribution based on a second failure-related dataset comprising second bitline threshold voltage data associated with a second memory device.

20 Claims, 11 Drawing Sheets

100

800

810 Receive first failure-related dataset

820 Determine first failure type distribution

830 Create training dataset including first failure-related dataset and first failure type distribution 840 Train failure type prediction model 850 Utilize failure type prediction model to predict second failure type distribution based on second failure-related dataset

900

910 Receive first component line dataset

920 Receive first post-fabrication testing dataset

930 Create training dataset including first component line dataset and first post-fabrication testing dataset 940 Train component line model 950 Utilize component line model to predict second failure type distribution based on second component line dataset

1000

1010 Receive first component line dataset

1020 Receive first failure-related dataset

1030 Create training dataset including first component line dataset and first failure-related dataset 1040 Train workload prediction model 1050 Utilize workload prediction model to predict second post-fabrication testing workload based on second component line dataset

MEMORY FAILURE ANALYSIS BASED ON BITLINE THRESHOLD VOLTAGE DISTRIBUTIONS

REFERENCE TO RELATED APPLICATIONS

This application claims the priority benefit of U.S. Provisional Application No. 63/468,681, filed May 24, 2023, which is incorporated by reference herein.

TECHNICAL FIELD

Embodiments of the disclosure relate generally to memory sub-systems, and more specifically, to memory failure analysis based on bitline threshold voltage distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
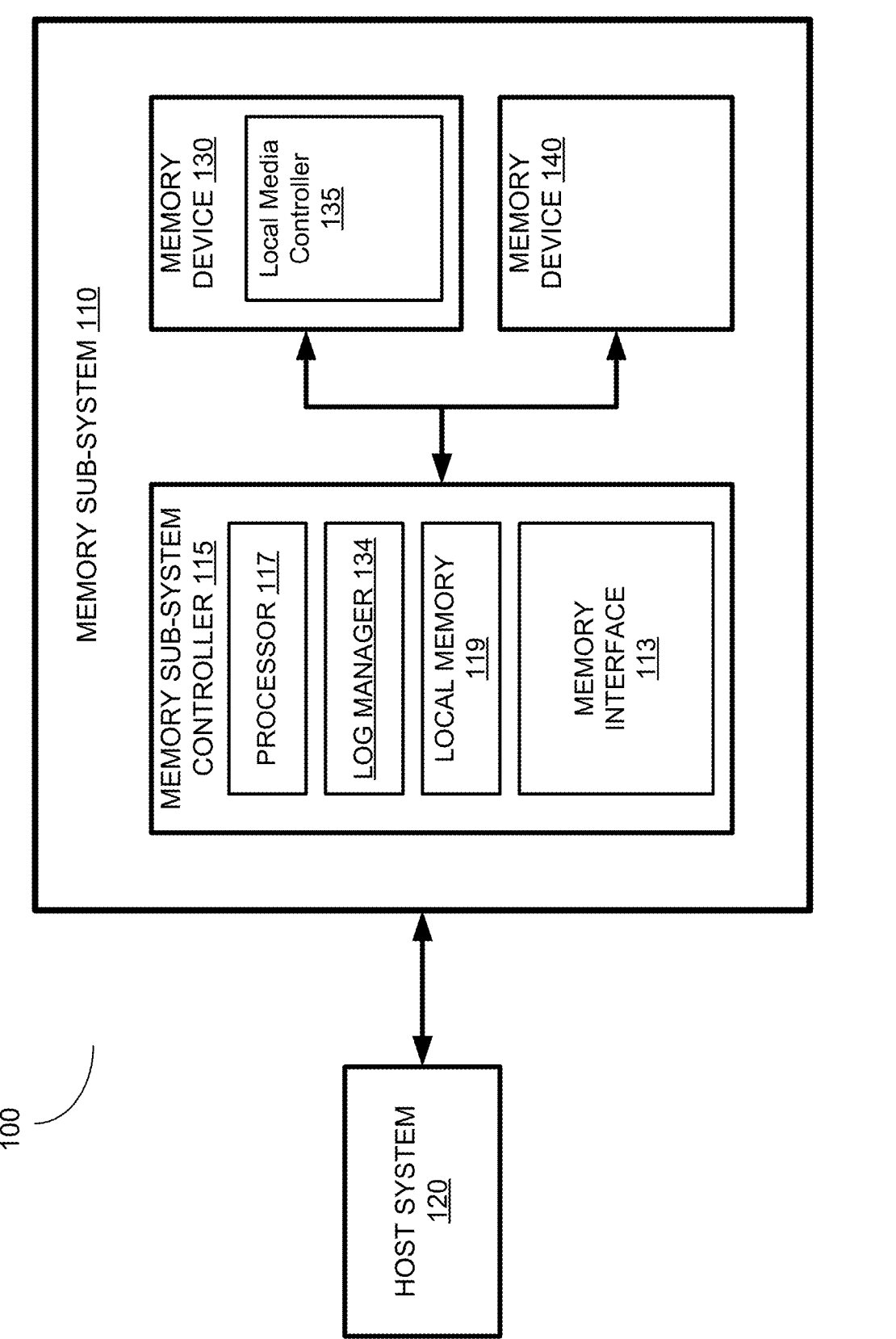
FIG. 1 illustrates an example computing system that includes a memory sub-system in accordance with one or more aspects of the present disclosure.

Aspects of the present disclosure are directed to memory failure analysis based on bitline threshold voltage distributions.

A memory sub-system can utilize one or more memory devices, including any combination of the different types of non-volatile memory devices and/or volatile memory devices, to store the data provided by a host system. Examples of storage devices and memory modules are described below in conjunction with FIG. 1.

In some embodiments, a memory sub-system may be represented by a solid-state drive (SSD), which may include one or more non-volatile memory devices. In some embodiments, the non-volatile memory devices can be provided by negative-and (NAND) type flash memory devices. Other examples of non-volatile memory devices are described below in conjunction with FIG. 1. A non-volatile memory device is a package of one or more dice. Each die can include one or more planes. A plane is a portion of a memory device that includes multiple memory cells. Some memory devices can include two or more planes. For some types of non-volatile memory devices (e.g., NAND devices), each plane includes a set of physical blocks. Each block includes a set of pages. "Block" herein shall refer to a set of contiguous or non-contiguous memory pages. A "block" can refer to a unit of the memory device used to store data and can include a group of memory cells. An example of a "block" is an "erasable block," which is the minimal erasable unit of memory, while "page" is a minimal writable unit of memory. Each page includes a set of memory cells. A memory cell is an electronic circuit that stores information.

A memory device can include multiple memory cells arranged in a two-dimensional grid. The memory cells are formed onto a silicon wafer in an array of columns and rows. A memory cell includes a capacitor that holds an electric charge and a transistor that acts as a switch controlling access to the capacitor. Accordingly, the memory cell can be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

Depending on the cell type, each memory cell can store one or more bits of binary information and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages (Vt) exhibited by the memory cell to one or more reference voltage levels in order to distinguish between two logical levels for single-level cell (SLCs) and between multiple logical levels for multi-level cells.

Memory access operations (e.g., a programming (write) operation, an erase operation, etc.) can be executed with respect to sets of the memory cells, e.g., in response to receiving memory access commands from the host. A memory access operation can specify the requested memory access operation (e.g., write, erase, read, etc.) and a logical address, which the memory sub-system would translate to a physical address identifying a set of memory cells (e.g., a block).

In operation, memory sub-systems, such as solid state drives (SSD), may exhibit various failures, which can be attributed to their underlying technological features, design features, production variations, and/or various other factors. Such failures may include, e.g., media failures (e.g., due to media wear), failures of other hardware (e.g., power management circuits), and/or firmware errors.

A failed memory sub-system may be shipped to the original equipment manufacturer (OEM) for failure analysis. Notably, the time elapsed between the failure detection and failure analysis may range from several hours to several days. Due to unavoidable shifts in the charge levels of memory cells over time, certain failure modes (e.g., caused by resistive defects) will no longer manifest themselves and/or will manifest themselves as different failure types by the time of the failure analysis. Accordingly, in order to yield accurate results, the failure analysis should mostly rely upon the failure-related data that has been logged by the memory subsystem at the time of failure. However, the data that is routinely logged by memory-subsystems might not always be representative of the failure mode. Furthermore, methods of analysis of physical defectivity can cause additional stress, leading to altered fail states. For instance, the act of rereading a partial-short within a resistive region could cause additional breakdown, leading to failure analysis teams observing a possible different root cause.

Implementations of the present disclosure alleviate the above-referenced and other deficiencies by implementing the failure analysis based on the bitline threshold voltage distributions that are logged by the memory sub-system upon detecting a failure. A bitline threshold voltage distribution shows, for every bitline of a chosen set of bitlines of a memory device, corresponding threshold voltage values that have caused the bitline to transition from a non-conductive state to a conductive state in response to the threshold voltage having been applied to a selected wordline of the memory device, as described in more detail herein below.

Accordingly, in order to facilitate the memory device failure analysis, a memory sub-system controller may maintain one or more logs containing failure-related data (including bitline threshold voltage distributions and associated metadata), error messages, event data, media endurance data, other device health data, etc. The logged failure-related data and other log data may be retrieved via a host interface and utilized for failure diagnostics, which involves determining the failure type.

In some implementations, determining the failure type may be performed by a trainable classifier that derives the failure type from the failure-related data including bitline threshold voltage distributions and associated metadata. Based on the input metadata, the failure-related data may be pre-processed to counteract the effects of the additional stress that might have been caused by the physical defectivity analysis. Certain regions, identified by the metadata, will have an "expected" degradation as a part of the failure logging process. This can be counteracted prior to performing the numerical analysis.

In some implementations, the trainable classifier may be implemented by one or more neural networks. Alternatively, the trainable classifier may employ decision trees, rule-based engines, and/or other suitable technologies. The classifier may be trained by a supervised learning process using a training dataset that includes multiple sets of failure-related data including bitline threshold voltage distributions and associated metadata labeled with corresponding failure types, as described in more detail herein below.

In some implementations, the logged failure-related data including bitline threshold voltage distributions and associated metadata may be employed for training component line models and/or identifying post-production component test workloads that would closely simulate field workloads ensuring that the testing procedure outcomes (e.g., the failure type distributions) would match, with a predefined accuracy, the outcomes observable in the field, as described in more detail herein below.

Various aspects of the methods and systems are described herein by way of examples, rather than by way of limitation. The systems and methods described herein can be implemented by hardware (e.g., general purpose and/or specialized processing devices, and/or other devices and associated circuitry), software (e.g., instructions executable by a processing device), or a combination thereof.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 ("controller") can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, the memory sub-system controller 115 includes a log manager 134 employed to perform failure-related data logging operations. Information stored by such logs may include, e.g., error messages, event data, failure-related data (including bitline threshold voltage distributions and associated metadata), media endurance data, other device health data, etc. The logged failure-related data and other log data may then be utilized for failure diagnostics, which involves determining the failure type, as described in more detail herein below. In some embodiments, at least part of the functionality of the log manager 134 can be performed by the local media controller 135. In some embodiments, log manager 134 is implemented by firmware, hardware components, or a combination of the above.

Figure 2:
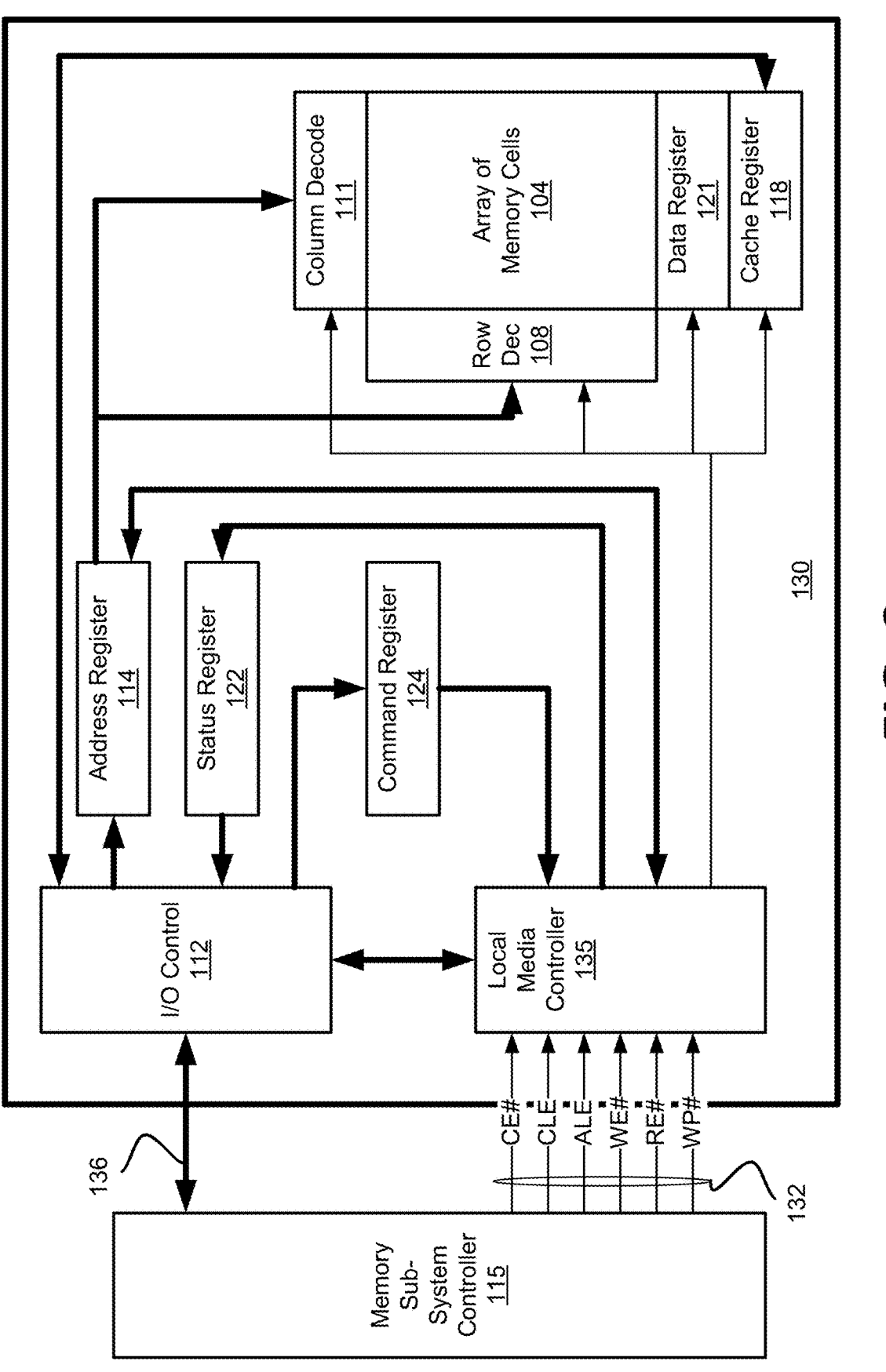
FIG. 2 is a block diagram of a memory device in communication with a memory sub-system controller of a memory sub-system, in accordance with one or more aspects of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 2) of at least a portion of array of memory cells 104 are capable of being programmed to one of at least two target data states.

Row decode circuitry 108 and column decode circuitry 111 are provided to decode address signals. Address signals are received and decoded to access the array of memory cells 204. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 108 and column decode circuitry 111 to control the row decode circuitry 108 and column decode circuitry 111 in response to the addresses.

The local media controller 135 is also in communication with a cache register 218. Cache register 118 latches data, either incoming or outgoing, as directed by the local media controller 135 to temporarily store data while the array of memory cells 104 is busy writing or reading, respectively, other data. During a programming operation (e.g., a write operation), data can be passed from the cache register 118 to the data register 121 for transfer to the array of memory cells 204; then new data can be latched in the cache register 118 from the I/O control circuitry 212. During a read operation, data can be passed from the cache register 118 to the I/O control circuitry 112 for output to the memory sub-system controller 115; then new data can be passed from the data register 121 to the cache register 218. The cache register 118 and/or the data register 121 can form (e.g., can form a portion of) a page buffer of the memory device 130. A page buffer can further include sensing devices (not shown in FIG. 2) to sense a data state of a memory cell of the array of memory cells 204, e.g., by sensing a state of a data line connected to that memory cell. A status register 122 can be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands can be received over input/output (I/O) pins [7:0] of I/O bus 136 at I/O control circuitry 112 and can then be written into command register 224. The addresses can be received over input/output (I/O) pins [7:0] of I/O bus 136 at I/O control circuitry 112 and can then be written into address register 214. The data can be received over input/output (I/O) pins [7:0] for an 8-bit device or input/output (I/O) pins [15:0] for a 16-bit device at I/O control circuitry 112 and then can be written into cache register 218. The data can be subsequently written into data register 121 for programming the array of memory cells 204.

In an embodiment, cache register 118 can be omitted, and the data can be written directly into data register 220. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 can not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) can be used in the various embodiments.

Figure 3:
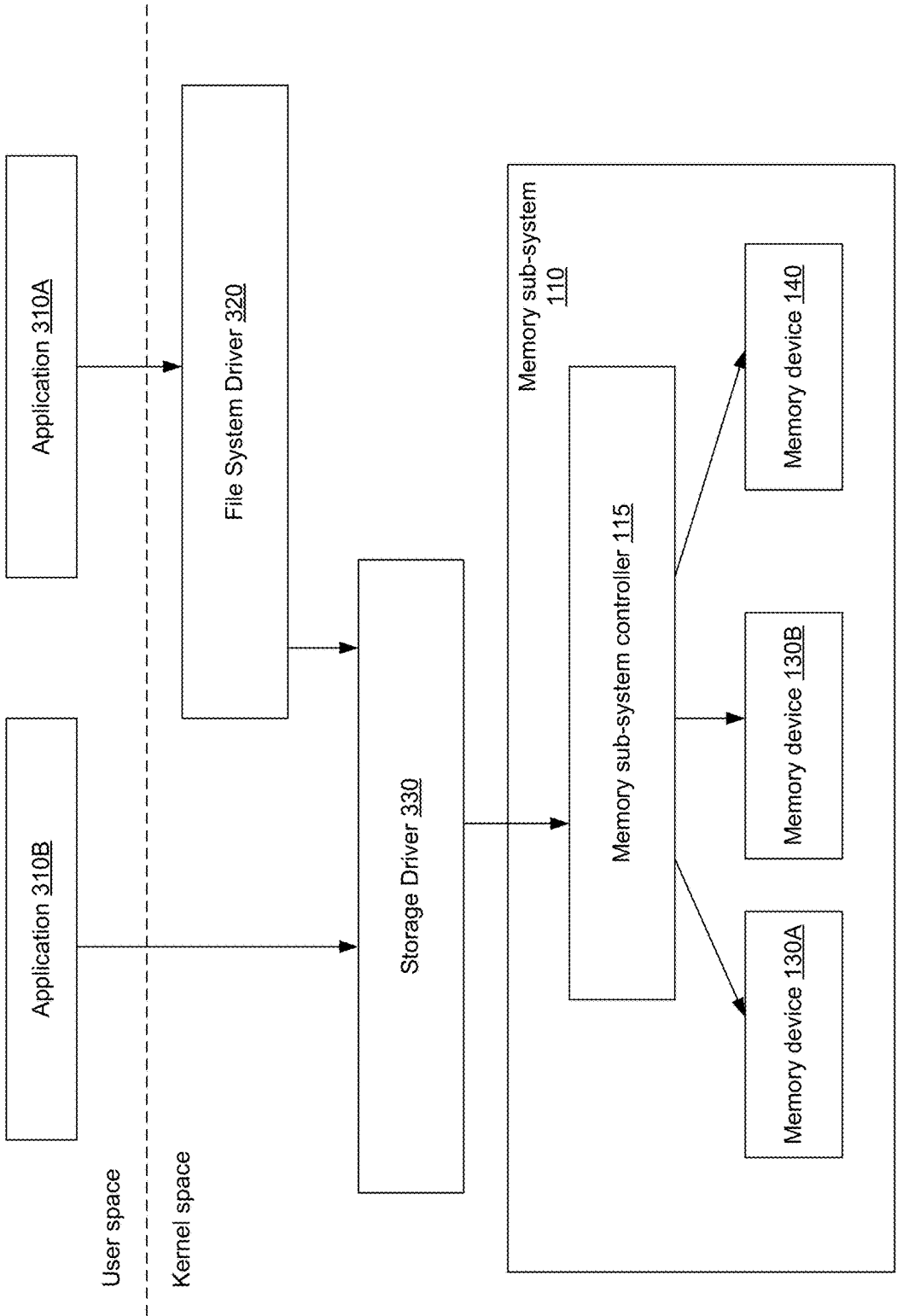
FIG. 3 schematically illustrates a programming architecture implemented by a host system in communication with a memory sub-system controller operating in accordance with one or more aspects of the present disclosure.

FIG. 3 schematically illustrates a programming architecture implemented by the host system 120 in communication with the memory sub-system controller 115 managing one or more memory devices 130, in accordance with one or more aspects of the present disclosure. As schematically illustrated by FIG. 3, the host system may run one or more applications 310A-310B. In an illustrative example, the application 310A may be in communication with the file system driver 320, which may be running in the kernel space of the host system 120 and may be employed for processing certain system calls, such as read and write calls initiated by one or more applications 310, including the application 310A, running in the user space of the host system 120. The file system driver 320 may be employed to translate the read, write, and other system calls issued by the application 310A into low-level application programming interface (API) calls to the storage driver 330, which, in turn may communicate to the memory sub-system controller 115. The storage driver 330 may be running in the kernel mode of the host system and may be employed to process API calls issued by the file system driver 320 and/or system calls issued by the application 310B into storage interface commands to be processed by the storage the memory sub-system controller 115.

In some implementations, the storage driver 330 may implement a block storage model, in which the data is grouped into blocks of one or more pre-defined sizes and is addressable by a block number. The block storage model may implement "read" and "write" command for storing and retrieving blocks of data. In an illustrative example, the storage driver 330 may implement a key-value storage model, in which the data is represented by the "value" component of a key-value pair is addressable by the "key" component of the key-value pair. The key value storage model may implement "put and get" commands, which are functionally similar to the "write" and "read" commands of the block storage model. Thus, the term "data item" as used herein may refer to a data block or to a key-value pair.

In some implementations, the file system driver 320 and/or the storage driver 330 may support I/O control commands for retrieving the logs maintained by the log manager 134 of the memory-subsystem 110.

As noted herein above, the log manager 134 may maintain one or more logs, which may be stored on one or more memory devices and retrieved via the host interface. Information stored by such logs may include warning and error messages, event data, media endurance data, other device health data, etc. In some implementations, responsive to detecting a failure of the memory sub-system or one of its memory devices, the log manager 134 may store, in one or more log files, the failure-related data, which may include including bitline threshold voltage distributions and associated metadata. The metadata logged at the time of failure may include identifiers of page, block, and/or die exhibiting the failure and associated program-erase counter (PEC) values, power-on-time, die temperature values, etc.

Figure 4:
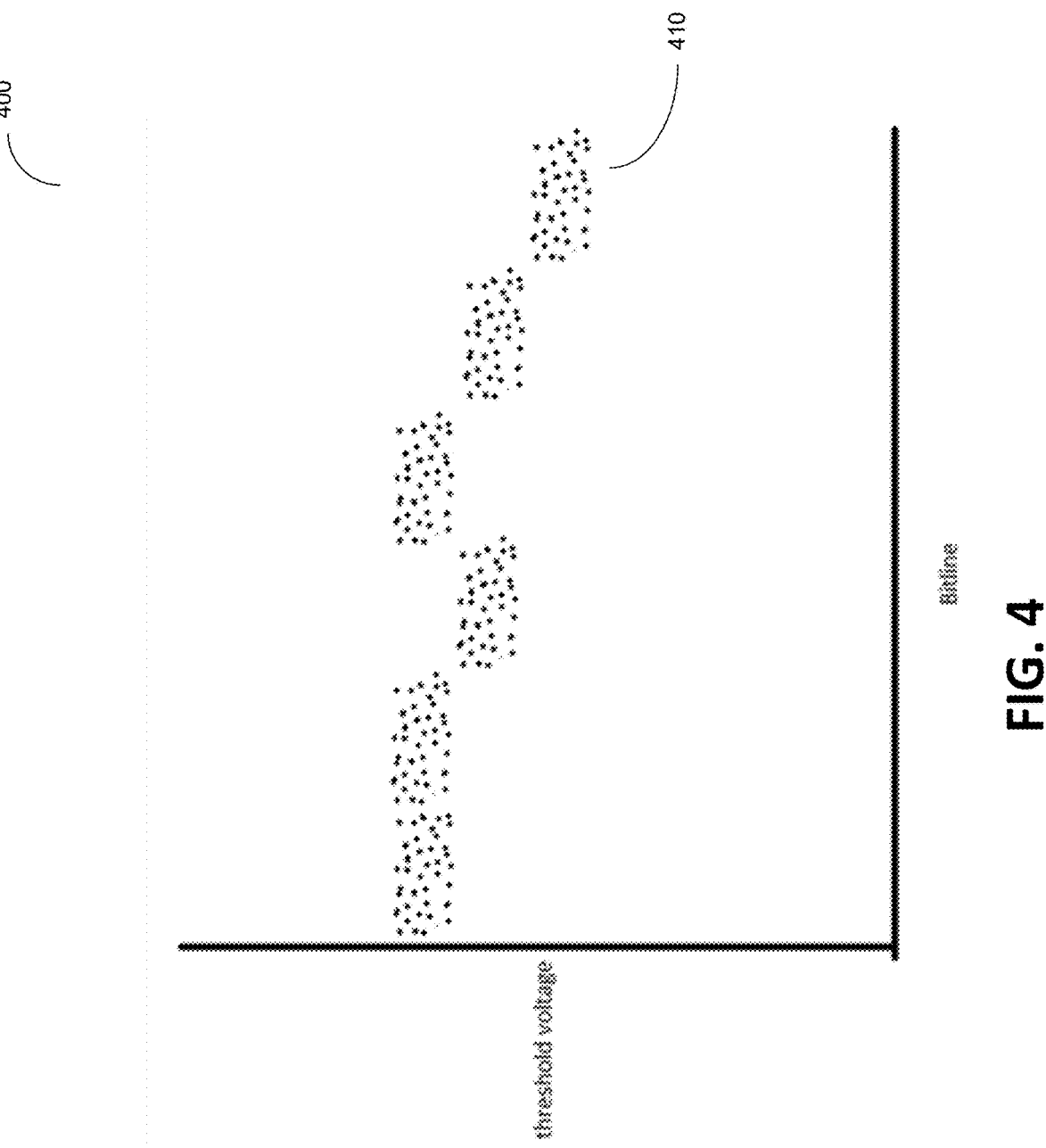
FIG. 4 schematically illustrates an example bitline threshold voltage distribution for a chosen wordline that may be captured and logged by a log manager, in accordance with aspects of the present disclosure.

FIG. 4 schematically illustrates an example bitline threshold voltage distribution that may be captured and logged by the log manager 134, in accordance with aspects of the present disclosure. As schematically illustrated by FIG. 4, for each bitline of a chosen set of bitlines of a memory device, plot 400 shows the threshold voltage values that have caused the bitline to transition from a non-conductive state to a conductive state in response to the threshold voltage having been applied to a selected wordline. In other words, for every dot in plot 400, its horizontal coordinate identifies a bitline, while the vertical coordinate represents the threshold voltage values that have caused the bitline to transition from a non-conductive state to a conductive state in response to the threshold voltage having been applied to a selected wordline. In an illustrative example of FIG. 4, the plot 400 of the bitline threshold voltage distribution has a tail 410 trailing off towards the lower threshold voltage values, which can be indicative of a resistive short or other contact within the media array ("failure type A").

In various illustrative example, general failure mechanisms may include oxide breakdowns, shorts, resistive contacts via oxide formation or other, pinchoff, or pillar misalignment. These failures might also be "soft" failures, which could be a symptom of slight process variation that can't be attributed to any specific defect mode.

Figure 5:
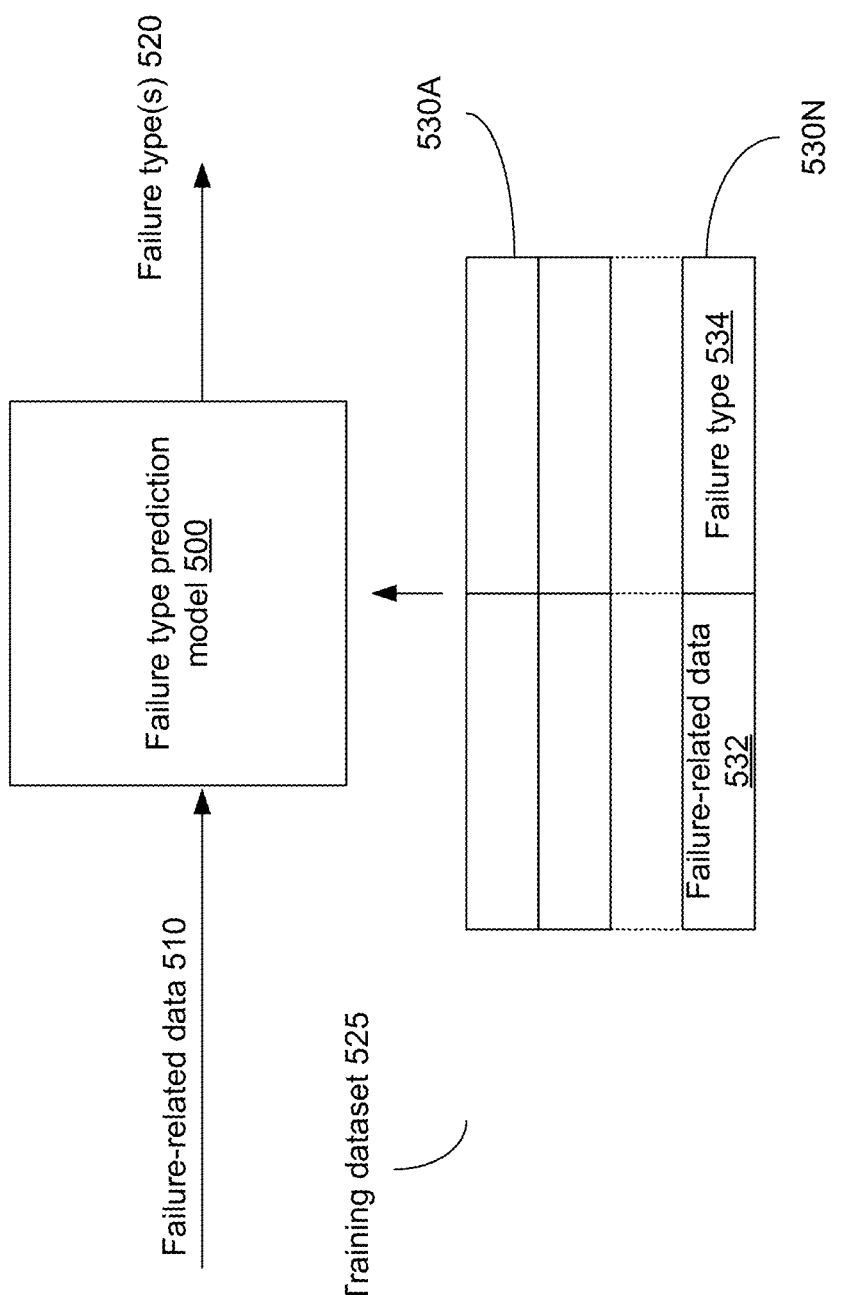
FIG. 5 schematically illustrates an example failure type prediction model operating in accordance with one or more aspects of the present disclosure.

As noted herein above, the bitline threshold voltage distribution and associate metadata data may be utilized for training failure type prediction models that determine failure types. FIG. 5 schematically illustrates an example failure type prediction model operating in accordance with one or more aspects of the present disclosure. As schematically illustrated by FIG. 5, the failure type prediction model 500 may receive failure-related data 510 including bitline threshold voltage distributions and associated metadata which can be extracted from one or more log files produced by the log manager 134. For each detected failure, the failure type prediction model 500 may yield the failure type(s) 520 derived from failure-related data 510.

In some implementations, the failure type prediction model 500 may by implemented by one or more trainable classifiers. In an illustrative example, each trainable classifier may be implemented by one or more neural networks. In other illustrative examples, classifiers operating in accordance with aspects of the present disclosure may employ decision trees, rule-based engines, and/or other suitable technologies.

In some implementations, further processing can be done on the bitline data via grouping; windowing, subsets via random selection or N selection (selecting 1 bit every N) to reduce sample size and computation within the system.

"Neural network" herein refers to a computational model, which may be implemented by software, hardware, or combination thereof. A neural network includes multiple inter-connected nodes called "artificial neurons," which loosely simulate neurons of a human brain. An artificial neuron may process a signal received, over a first edge, from another artificial neuron and transmit the transformed signal over a second edge to a third artificial neuron. The output of each artificial neuron may be represented by a mathematical transformation of a combination of its inputs. Edge weights, which increase or attenuate the signals being transmitted through respective edges connecting the neurons, as well as other network parameters, may be determined by training the network.

A supervised training process may utilize a training dataset that includes a set of data items labeled in accordance with known classification. In an illustrative example, training a neural network involves initializing the edge weights and/or other network parameters to random or predetermined values. For every input data item in the training dataset, the neural network is activated to produce an output, which is then compared with the desired output specified by the label associated with the input data item in the training dataset, and the error is back-propagated through layers of the neural network, in which the weights and/or other parameters are adjusted accordingly. This process may be repeated until the output error falls below a predetermined threshold.

As noted herein above, a classifier operating in accordance with aspects of the present disclosure may be trained by a supervised learning process using a training dataset that utilizes the failure-related data which is extracted from the log files produced by the log manager 134. As schematically illustrated by FIG. 5, each item 530A-530N of the training dataset 525 may include failure-related data 532 (including bitline threshold voltage distributions and associated metadata) labeled with a corresponding failure type 534.

The trained failure type prediction model may be employed to process the failure-related data extracted from one or more log files of a failed memory-subsystem in order to determine the actual failure type or predict a potential failure type. In an illustrative example, a failed memory sub-system may be shipped to the original equipment manufacturer (OEM) for failure analysis, and the log data extraction may be performed by the OEM. In an illustrative example, the log data may be extracted in the field upon detecting a memory sub-system failure, and the extracted log data may be transmitted to the OEM for failure analysis.

In another illustrative example, the log data may be periodically extracted in the field irrespectively of the failure occurrences and transmitted to OEM for early detection of potential memory sub-system failures.

As further noted herein above, the process of memory-subsystem fabrication may involve post-fabrication testing of memory devices and/or their components. The testing process may involve applying certain workloads to the memory devices (e.g., program-erase cycles storing certain patterns of data, which may, in various examples, include random and/or regular patterns). However, since the field workload parameters may not be known at the time of post-fabrication testing, the results produced by the post-fabrication testing may significantly differ from the results observable in the field.

Furthermore, various component line models that predict failure type based on component line data and/or post-fabrication testing data would not yield the results that are similar to the field-observable outcomes unless such models are trained using training datasets that adequately reflect the failure type distributions observable in the field. In various illustrative examples, the component line data may include values of parameters that characterize a memory device or its components (e.g., dies), and can be yielded by a manufacturing test such as current measurement, time0 bit failures or parametric values such as CMOS oscillator variation. In some implementations, the component line data may include fabrication metrics such as physical parameters including film deposition thicknesses, etc.

Figure 6:
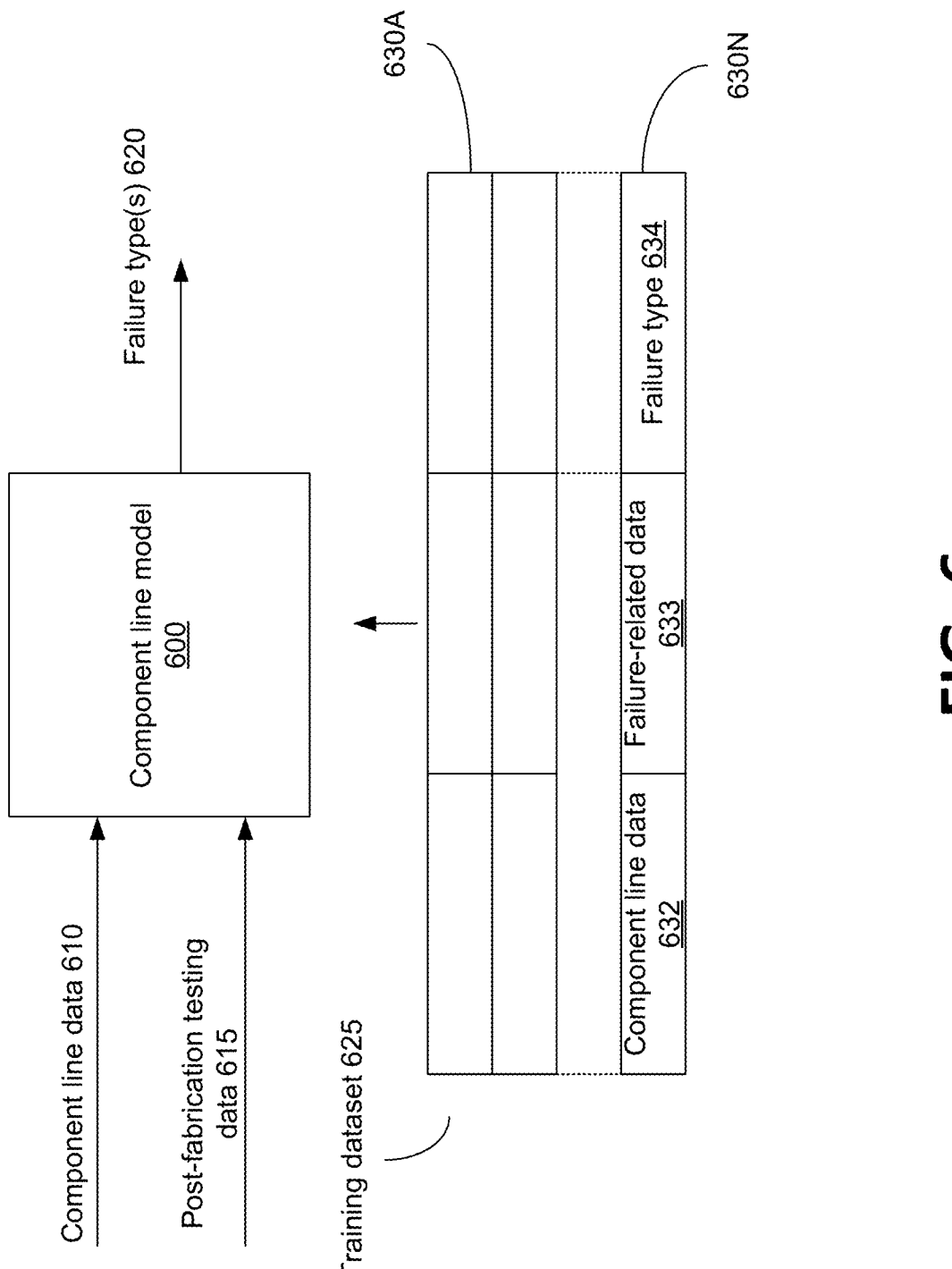
FIG. 6 schematically illustrates an example component line model operating in accordance with one or more aspects of the present disclosure.

FIG. 6 schematically illustrates an example component line model operating in accordance with one or more aspects of the present disclosure. As schematically illustrated by FIG. 6, the component line model 600 may receive component line data 610 for a memory device or component. In some implementations, the component line model 600 may further receive the post-fabrication testing data 615 for the memory device or component. The component line model 600 may yield the failure type(s) 620 that would be exhibited in the field by a memory device or component characterized by the input component line data 610 and/or post-fabrication testing data 615. The post-fabrication testing data may include bitline threshold voltage distributions and associated metadata for the memory device or component.

In some implementations, the component line model 600 may by implemented by one or more trainable classifiers. In an illustrative example, each trainable classifier may be implemented by one or more neural networks. In other illustrative examples, classifiers operating in accordance with aspects of the present disclosure may employ decision trees, rule-based engines, and/or other suitable technologies.

In order to ensure that the component line model 600 yields the results that match, with a predefined accuracy, the field-observable outcomes, the component line model 600 may be trained on training datasets that include, for each memory device or component of a chosen set of memory devices and/or components, both component line data and the field-observed failure-related data including bitline threshold voltage distributions and associated metadata. In an illustrative example, the field-observed failure related data may be extracted from one or more log files of a failed memory sub-system that has been shipped to the OEM for failure analysis. In an illustrative example, the field-observed failure related data may be extracted in the field from one or more log files of a failed memory sub-system and may be transmitted to the OEM for failure analysis.

As schematically illustrated by FIG. 6, each item 630A-630N of the training dataset 625 may include component line data 632 for a particular memory device or component, field-observed failure-related data 633 for the same memory device or component (including bitline threshold voltage distributions and associated metadata), and a corresponding filed-observed failure type 634. In some implementations, each item 630A-630N of the training dataset 625 may further include post-fabrication test data for the same memory device or component (including bitline threshold voltage distributions and associated metadata).

The trained component line model may be employed to process component line data and/or post-fabrication test data associated with a memory device or component in order to determine the actual failure type or predict a potential failure type.

As further noted herein above, the logged failure-related data including bitline threshold voltage distributions and associated metadata may be employed for identifying post-fabrication testing workloads that would closely simulate field workloads ensuring that the testing procedure outcomes (e.g., the failure type distributions) would match, with a predefined accuracy, the outcomes observable in the field. In some implementations, a workload prediction model may be trained to determine the post-fabrication test workload that would, for a given memory device or component character-ized by component line data, produce parameters of a workload that, when utilized for performing the post-fabri-cation testing of the memory device or component, would yield outcomes that would match, with a predefined accu-racy, the outcomes that would have been observed in the field for the same memory device or component.

Figure 7:
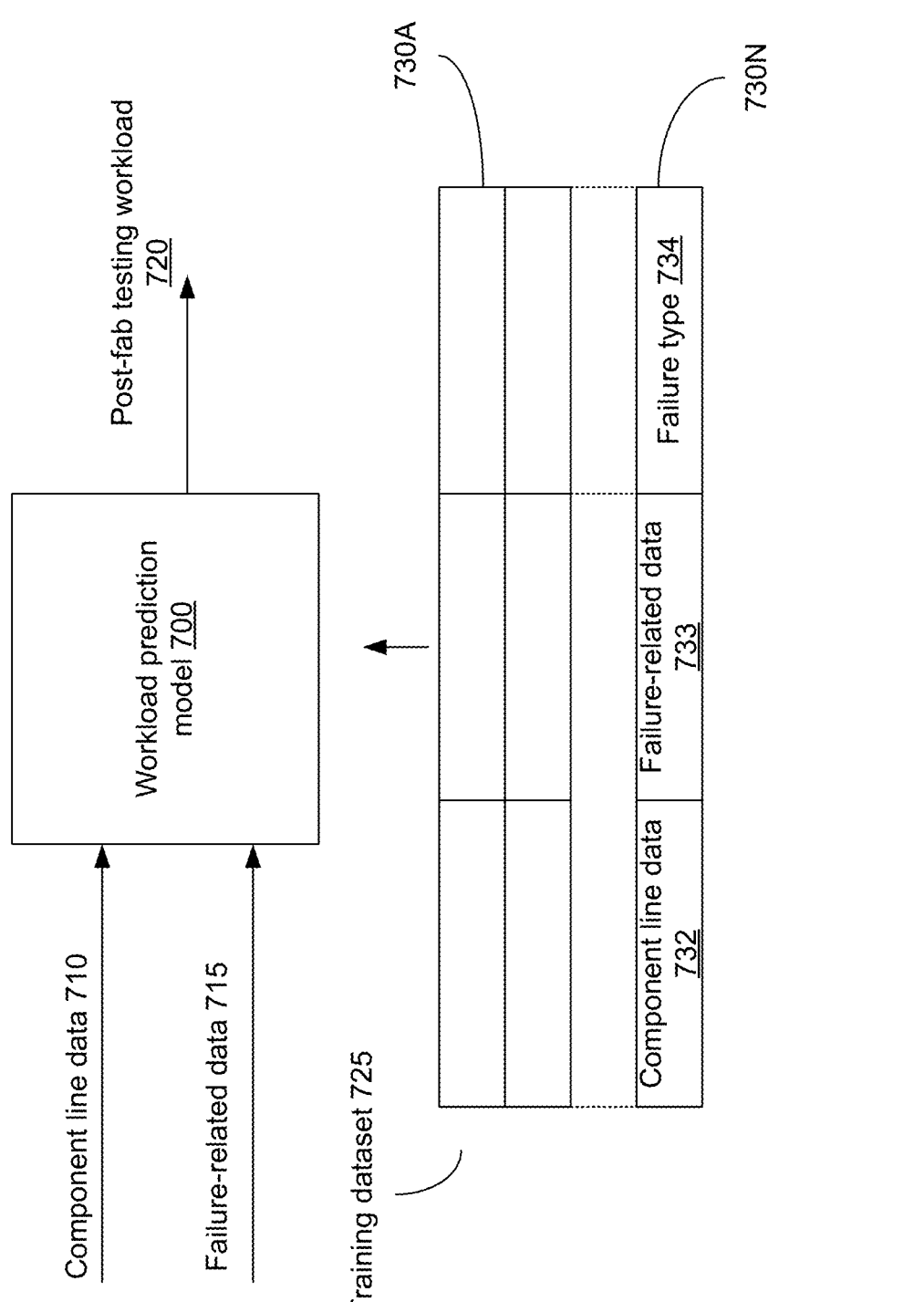
FIG. 7 schematically illustrates an example workload prediction model operating in accordance with one or more aspects of the present disclosure.

FIG. 7 schematically illustrates an example workload prediction model operating in accordance with one or more aspects of the present disclosure. As schematically illus-trated by FIG. 7, the workload prediction model 700 may receive component line data 710 for a memory device or component. The workload prediction model 700 may further receive field-observed failure-related data 715 (including bitline threshold voltage distributions and associated meta-data) for the memory device or component. The workload prediction model 700 may yield the post-fabrication testing workload parameters derived from the input component line data 710 and field-observed failure-related data 715.

In some implementations, the workload prediction model 700 may by implemented by one or more trainable classi-fiers. In an illustrative example, each trainable classifier may be implemented by one or more neural networks. In other illustrative examples, classifiers operating in accordance with aspects of the present disclosure may employ decision trees, rule-based engines, and/or other suitable technologies.

The workload prediction model 700 may be trained on training datasets that include, for each memory device or component of a chosen set of memory devices and/or components, both component line data and the field-ob-served failure-related data including bitline threshold volt-age distributions and associated metadata. In an illustrative example, the field-observed failure related data may be extracted from one or more log files of a failed memory sub-system that has been shipped to the OEM for failure analysis. In an illustrative example, the field-observed fail-ure related data may be extracted in the field from one or more log files of a failed memory sub-system and may be transmitted to the OEM for failure analysis.

As schematically illustrated by FIG. 7, each item 730A-730N of the training dataset 725 may include component line data 732 for a particular memory device or component, field-observed failure-related data 733 for the same memory device or component (including bitline threshold voltage distributions and associated metadata), and a corresponding failure type 734.

The trained workload prediction model may be employed to process component line data associated with a memory device or component in order to determine the actual failure type or predict a potential failure type.

Figure 8:
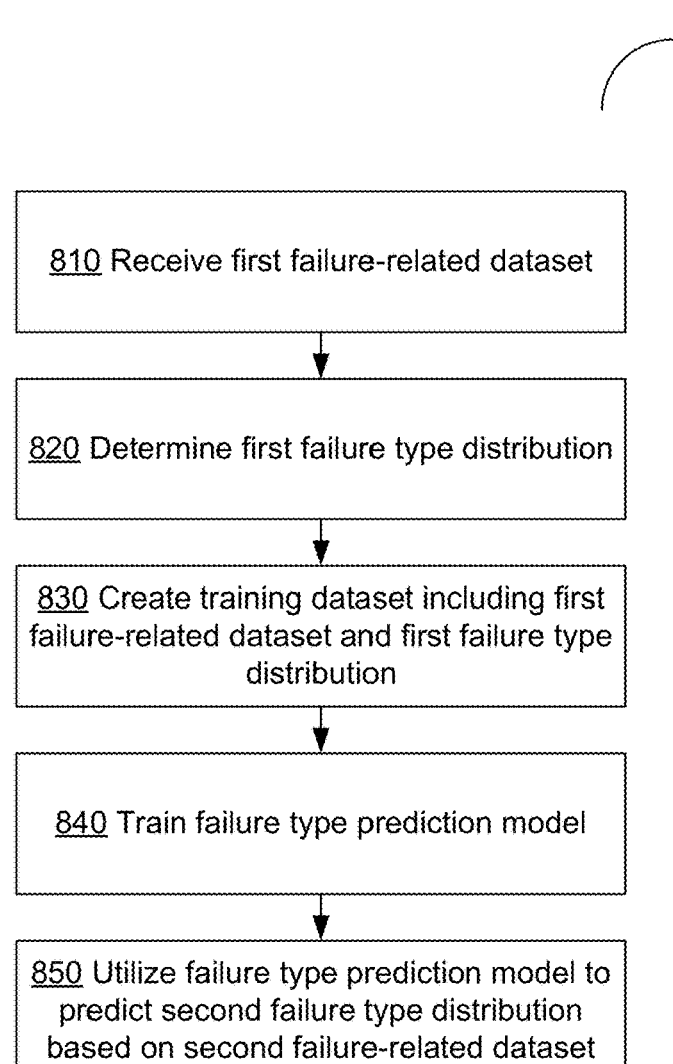
FIG. 8 schematically illustrates an example method of implementing a failure type prediction model, in accordance with aspects of the present disclosure.

FIG. 8 schematically illustrates an example method 800 of implementing a failure type prediction model, in accor-dance with aspects of the present disclosure. The method 800 can be performed by processing logic that can include hardware (e.g., general purpose or specialized processing devices, circuitry, dedicated logic, programmable logic, microcode, integrated circuits, etc.), software (e.g., instruc-tions run or executed on a processing device), or various combinations thereof. In some implementations, method 800 may be performed by a single processing thread. Alter-natively, method 800 may be performed by two or more processing threads, each thread executing one or more individual functions, routines, subroutines, or operations of the method. In an illustrative example, the processing threads implementing method 800 may be synchronized (e.g., using semaphores, critical sections, and/or other thread synchronization mechanisms). Alternatively, the processing threads implementing method 800 may be executed asyn-chronously with respect to each other. In some embodi-ments, the method 800 is performed by the example com-puter system 1100 of FIG. 11. Operations of the method 800 can be specified by a sequence of command codes, which the processing logic can retrieve from a dedicated storage location. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

As schematically illustrated by FIG. 8, at operation 810, the processing logic implementing the method receives a first failure-related dataset reflecting a first bitline threshold voltage distribution associated with a first memory device. The first bitline threshold voltage distribution may specify, for every bitline of a chosen set of bitlines of the first memory device, one or more threshold voltage values that have caused the bitline to transition from a non-conductive state to a conductive state in response to a threshold voltage value of the one or more threshold voltage values having been applied to a selected wordline of the memory device. The first failure-related dataset can further comprise a plu-rality of metadata items associated with the first bitline threshold voltage distribution. The first failure-related data-set can be extracted from one or more log files maintained by a memory sub-system controller, as described in more detail herein above.

At operation 820, the processing logic determines, based on the first failure-related dataset, a first failure type distri-bution for the first memory device. In an illustrative example, the first failure type distribution reflected by the first failure-related dataset is built from one or more graphi-cal user interface (GUI) inputs allowing a user to label the first bitline threshold voltage distribution with one or more failure types. In an illustrative example, the first failure type distribution reflected by the first failure-related dataset is determined by applying a rule-based logic or a decision tree-based logic to the first failure-related dataset.

At operation 830, the processing logic creates a training dataset comprising the first failure-related dataset and the first failure type distribution, as described in more detail herein above.

At operation 840, the processing logic trains, using the training dataset, a failure type prediction model to determine, for a second memory device, a second failure type distribution based on a second failure-related dataset comprising second bitline threshold voltage data associated with a second memory device, as described in more detail herein above.

At operation 850, the processing logic utilizes the failure type prediction model to determine, for the second memory device, the second failure type distribution based on the second failure-related dataset comprising second bitline threshold voltage data associated with the second memory device, as described in more detail herein above.

Figure 9:
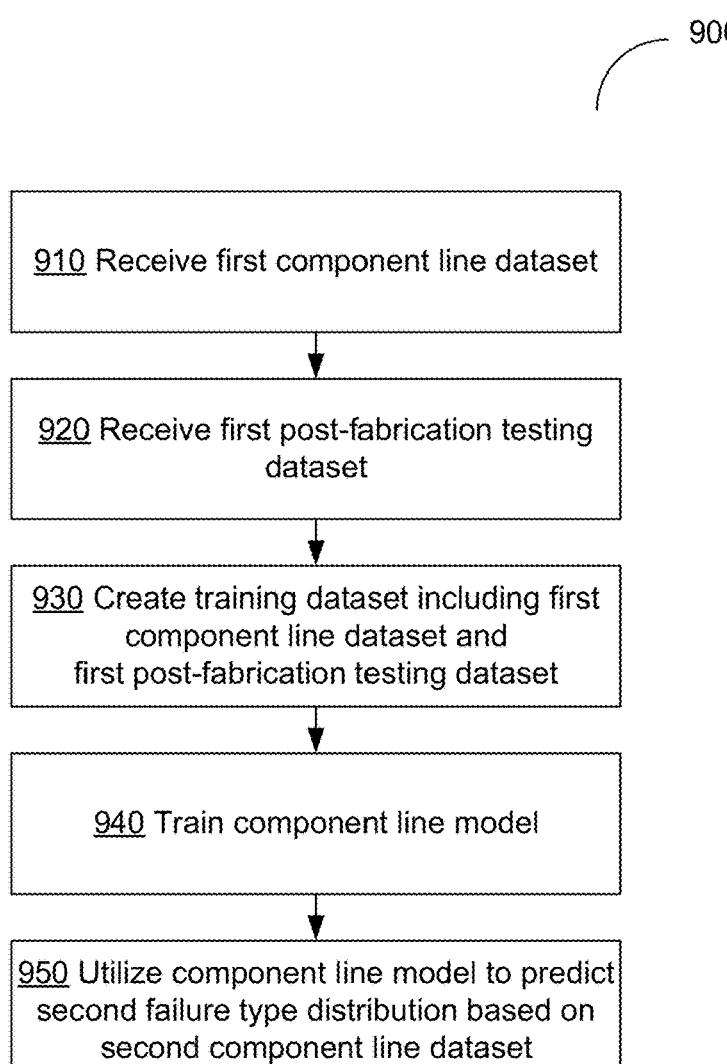
FIG. 9 schematically illustrates an example method of implementing a failure type prediction model, in accordance with aspects of the present disclosure.

FIG. 9 schematically illustrates an example method 900 of implementing a failure type prediction model, in accordance with aspects of the present disclosure. The method 900 can be performed by processing logic that can include hardware (e.g., general purpose or specialized processing devices, circuitry, dedicated logic, programmable logic, microcode, integrated circuits, etc.), software (e.g., instructions run or executed on a processing device), or various combinations thereof. In some implementations, method 900 may be performed by a single processing thread. Alternatively, method 900 may be performed by two or more processing threads, each thread executing one or more individual functions, routines, subroutines, or operations of the method. In an illustrative example, the processing threads implementing method 900 may be synchronized (e.g., using semaphores, critical sections, and/or other thread synchronization mechanisms). Alternatively, the processing threads implementing method 900 may be executed asynchronously with respect to each other. In some embodiments, the method 900 is performed by the example computer system 1100 of FIG. 11. Operations of the method 900 can be specified by a sequence of command codes, which the processing logic can retrieve from a dedicated storage location. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

As schematically illustrated by FIG. 9, at operation 910, the processing logic implementing the method receives a first component line dataset associated with a first memory device.

At operation 920, the processing logic receives a first post-fabrication testing dataset comprising a first bitline threshold voltage distribution associated with the first memory device. The first failure-related dataset can be extracted from one or more log files maintained by a memory sub-system controller, as described in more detail herein above.

At operation 930, the processing logic creates a training dataset comprising the first component line dataset and the first post-fabrication testing dataset, as described in more detail herein above.

At operation 940, the processing logic trains, using the training dataset, a component line model to predict, based on a second component line dataset associated with a second memory device and a second post-fabrication testing dataset comprising a second bitline threshold voltage distribution associated with the second memory device, a second failure type distribution to be exhibited in the field by the second memory device, as described in more detail herein above.

At operation 950, the processing logic utilizes the component line model to predict, based on the second component line dataset associated with the second memory device and the second post-fabrication testing dataset comprising the second bitline threshold voltage distribution associated with the second memory device, the second failure type distribution to be exhibited in the field by the second memory device, as described in more detail herein above.

Figure 10:
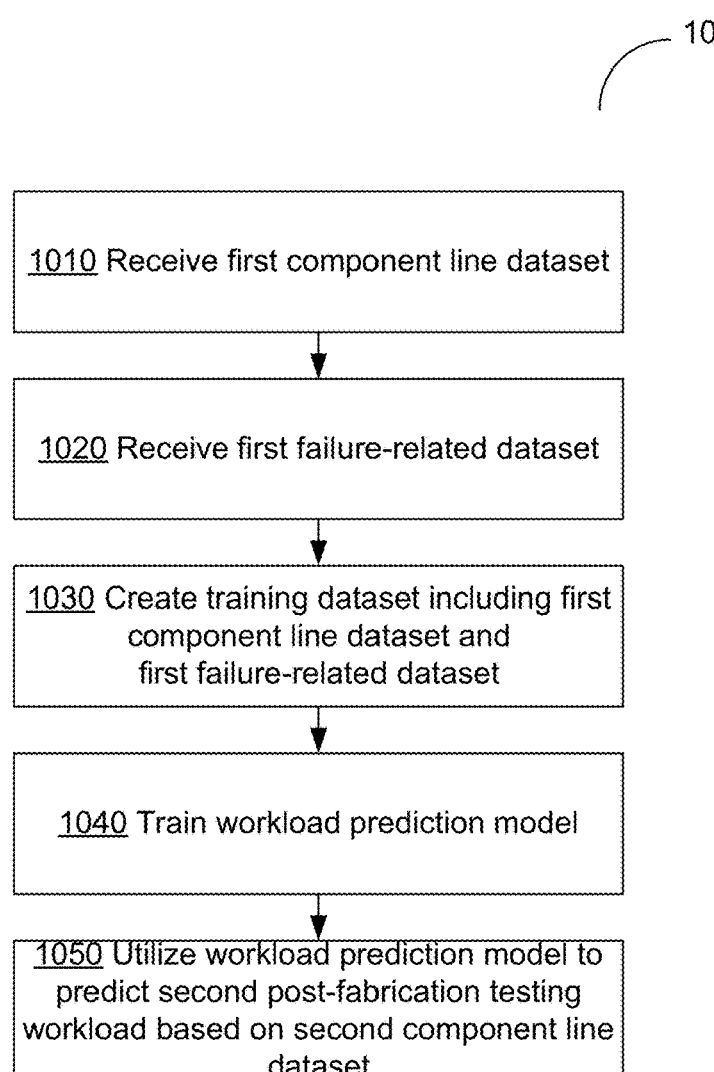
FIG. 10 schematically illustrates an example method of implementing a workload prediction model, in accordance with aspects of the present disclosure.

FIG. 10 schematically illustrates an example method 1000 of implementing a workload prediction model, in accordance with aspects of the present disclosure. The method 1000 can be performed by processing logic that can include hardware (e.g., general purpose or specialized processing devices, circuitry, dedicated logic, programmable logic, microcode, integrated circuits, etc.), software (e.g., instructions run or executed on a processing device), or various combinations thereof. In some implementations, method 1000 may be performed by a single processing thread. Alternatively, method 1000 may be performed by two or more processing threads, each thread executing one or more individual functions, routines, subroutines, or operations of the method. In an illustrative example, the processing threads implementing method 1000 may be synchronized (e.g., using semaphores, critical sections, and/or other thread synchronization mechanisms). Alternatively, the processing threads implementing method 1000 may be executed asynchronously with respect to each other. In some embodiments, the method 1000 is performed by the example computer system 1100 of FIG. 11. Operations of the method 1000 can be specified by a sequence of command codes, which the processing logic can retrieve from a dedicated storage location. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

As schematically illustrated by FIG. 10, at operation 1010, the processing logic implementing the method receives a first component line dataset associated with a first memory device.

At operation 1020, the processing logic receives a first failure-related dataset comprising a first bitline threshold voltage distribution associated with the first memory device. The first failure-related dataset can be extracted from one or more log files maintained by a memory sub-system controller, as described in more detail herein above.

At operation 1030, the processing logic creates a training dataset comprising the first component line dataset and the first failure-related dataset, as described in more detail herein above.

At operation 1040, the processing logic trains, using the training dataset, a workload prediction model to predict, based on a second component line dataset associated with a second memory device and a second bitline threshold voltage distribution associated with the second memory device, a second post-fabrication testing workload to be applied to the second memory device in order to yield a post-fabrication testing outcome that would match, with a predefined accuracy, a filed-observable outcome for the second memory device, as described in more detail herein above.

Figure 11:
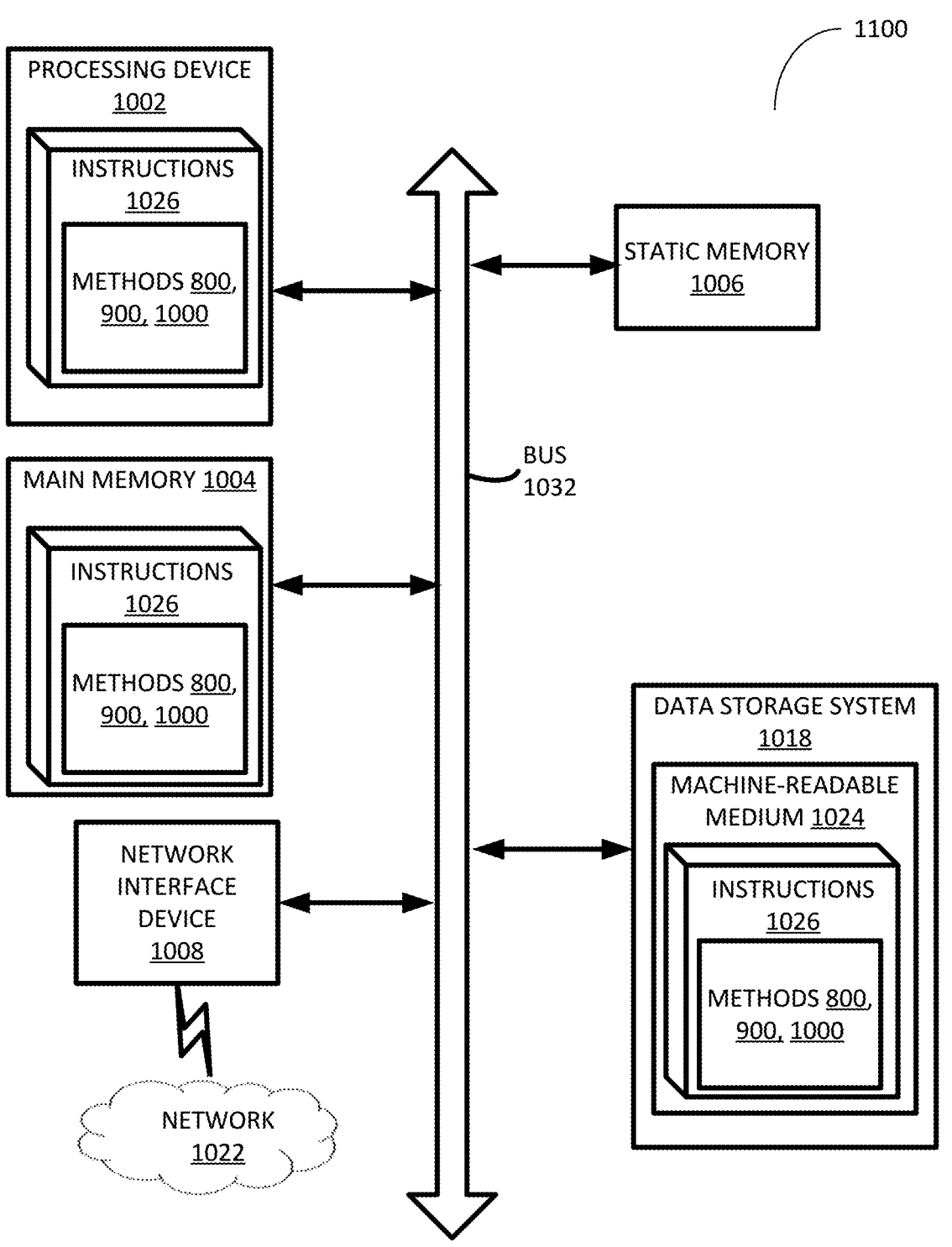
FIG. 11 illustrates an example machine of a computer system within which a set of instructions, for causing the machine to perform any one or more of the methodologies discussed herein, can be executed.

At operation 1050, the processing logic utilizes the workload prediction model to predict, based on the second component line dataset associated with the second memory device and the second bitline threshold voltage distribution associated with the second memory device, the second post-fabrication testing dataset to be applied to the second memory device in order to yield a post-fabrication testing outcome that would match, with a predefined accuracy, a filed-observable outcome for the second memory device, as described in more detail herein above FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to perform workflows and methods 800, 900, 1000). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1032.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1100 can further include a network interface device 1009 to communicate over the network 1022.

The data storage system 1018 can include a machine-readable storage medium 1024 (also known as a computer-readable medium, such as a non-transitory computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1100, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1026 include instructions to implement functionality corresponding to programming manager 134 of FIG. 1, including workflows and methods 800, 900, 1000. While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

All of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:

receiving, by a processing device, a first failure-related dataset reflecting a first bitline threshold voltage distribution associated with a first memory device;

determining, based on the first failure-related dataset, a first failure type distribution for the first memory device;

creating a training dataset comprising the first failure-related dataset and the first failure type distribution; and training, using the training dataset, a failure type prediction model to determine, for a second memory device, a second failure type distribution based on a second failure-related dataset comprising second bitline threshold voltage data associated with a second memory device.

2. The method of claim 1, wherein the first bitline threshold voltage distribution specifies, for every bitline of a chosen set of bitlines of the first memory device, one or more threshold voltage values that have caused the bitline to transition from a non-conductive state to a conductive state in response to a threshold voltage value of the one or more threshold voltage values having been applied to a selected wordline of the memory device.

3. The method of claim 1, wherein the first failure-related dataset further comprises a plurality of metadata items associated with the first bitline threshold voltage distribution.

4. The method of claim 3, wherein the plurality of metadata items comprises at least one of: an identifier of a page exhibiting the failure, an identifier of a block exhibiting the failure, an identifier of a die exhibiting the failure, a program-erase counter (PEC) value, a power-on-time, or a die temperature.

5. The method of claim 1, wherein receiving the first failure-related dataset further comprises:

extracting the first bitline threshold voltage distribution from a log file retrieved from a memory sub-system comprising the first memory device.

6. The method of claim 1, wherein the failure type prediction model is implemented by one or more neural networks.

7. The method of claim 1, further comprising:

determining, by the failure type prediction model, a third failure type distribution based on a third failure-related dataset comprising third bitline threshold voltage data associated with a third memory device.

8. A system, comprising:

a memory; and a processor, coupled to the memory, the processor configured to:

receive a first component line dataset associated with a first memory device;

receive a first post-fabrication testing dataset comprising a first bitline threshold voltage distribution associated with the first memory device;

create a training dataset comprising the first component line dataset and the first post-fabrication testing dataset; and train, using the training dataset, a component line model to predict, based on a second component line dataset associated with a second memory device and a second post-fabrication testing dataset comprising a second bitline threshold voltage distribution associated with the second memory device, a second failure type distribution to be exhibited in a field by the second memory device.

9. The system of claim 8, wherein the first bitline threshold voltage distribution specifies, for every bitline of a chosen set of bitlines of the first memory device, one or more threshold voltage values that have caused the bitline to transition from a non-conductive state to a conductive state in response to a threshold voltage value of the one or more threshold voltage values having been applied to a selected wordline of the memory device.

10. The system of claim 8, wherein the first failure-related dataset further comprises a plurality of metadata items associated with the first bitline threshold voltage distribution.

11. The system of claim 10, wherein the plurality of metadata items comprises at least one of: an identifier of a page exhibiting the failure, an identifier of a block exhibiting the failure, an identifier of a die exhibiting the failure, a program-erase counter (PEC) value, a power-on-time, or a die temperature.

12. The system of claim 8, wherein the component line model is implemented by one or more neural networks.

13. The system of claim 8, wherein the component line dataset associated with a first memory device comprises a plurality of values of respective parameters characterizing the first memory device.

14. The system of claim 8, wherein the processor is further configured to:

determine, by the component line model, based on a third component line dataset associated with a third memory device and a third post-fabrication testing dataset comprising a third bitline threshold voltage distribution associated with the third memory device, a third failure type distribution to be exhibited in a field by the third memory device.

15. A computer-readable non-transitory storage medium comprising executable instructions that, when executed by a controller of a system comprising one or more memory devices, cause the controller to:

receive a first component line dataset associated with a first memory device;

receive a first failure-related dataset comprising a first bitline threshold voltage distribution associated with the first memory device;

create a training dataset comprising the first component line dataset and the first failure-related dataset; and train, using the training dataset, a workload prediction model to predict, based on a second component line dataset associated with a second memory device and a second bitline threshold voltage distribution associated with the second memory device, a second post-fabrication testing dataset to be applied to the second memory device in order to yield a post-fabrication testing outcome that would match, with a predefined accuracy, a filed-observable outcome for the second memory device.

16. The computer-readable non-transitory storage medium of claim 15, wherein the first bitline threshold voltage distribution specifies, for every bitline of a chosen set of bitlines of the first memory device, one or more threshold voltage values that have caused the bitline to transition from a non-conductive state to a conductive state in response to a threshold voltage value of the one or more threshold voltage values having been applied to a selected wordline of the memory device.

17. The computer-readable non-transitory storage medium of claim 15, wherein the first failure-related dataset further comprises a plurality of metadata items associated with the first bitline threshold voltage distribution.

18. The computer-readable non-transitory storage medium of claim 15, wherein the workload prediction model is implemented by one or more neural networks.

19. The computer-readable non-transitory storage medium of claim 15, wherein the component line dataset associated with a first memory device comprises a plurality of values of respective parameters characterizing the first memory device.

20. The computer-readable non-transitory storage medium of claim 15, wherein the processor is further configured to:

determine, by the workload prediction model, based on a second component line dataset associated with a second memory device and a second bitline threshold voltage distribution associated with the second memory device, a second post-fabrication testing dataset to be applied to the second memory device in order to yield a post-fabrication testing outcome that would match, with a predefined accuracy, a filed-observable outcome for the second memory device.

* * * * *